(12) United States Patent
Schepis et al.

(10) Patent No.: US 9,966,457 B2
(45) Date of Patent: May 8, 2018

(54) TRANSISTOR STRUCTURE WITH VARIED GATE CROSS-SECTIONAL AREA

(71) Applicant: GLOBALFOUNDRIES INC., Grand Cayman (KY)

(72) Inventors: Dominic J. Schepis, Wappingers Falls, NY (US); Alexander Reznicek, Troy, NY (US); Pranita Kerber, Mount Kisco, NY (US); Qiqing C. Ouyang, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/073,740

(22) Filed: Mar. 18, 2016

(65) Prior Publication Data

US 2017/0271483 A1    Sep. 21, 2017

(51) Int. Cl.
| | |
|---|---|
| H01L 27/088 | (2006.01) |
| H01L 29/66 | (2006.01) |
| H01L 29/78 | (2006.01) |
| H01L 29/423 | (2006.01) |
| H01L 21/321 | (2006.01) |
| H01L 21/306 | (2006.01) |
| H01L 21/324 | (2006.01) |
| H01L 21/768 | (2006.01) |

(52) U.S. Cl.
CPC .. *H01L 29/66818* (2013.01); *H01L 21/30604* (2013.01); *H01L 21/321* (2013.01); *H01L 21/324* (2013.01); *H01L 21/76897* (2013.01); *H01L 29/42356* (2013.01); *H01L 29/66545* (2013.01); *H01L 29/785* (2013.01)

(58) Field of Classification Search
CPC ......... H01L 29/66818; H01L 21/30604; H01L 21/321
See application file for complete search history.

(56) References Cited

U.S. PATENT DOCUMENTS

| | | | | |
|---|---|---|---|---|
| 8,729,634 | B2 * | 5/2014 | Shen | H01L 29/66818 257/368 |
| 8,895,395 | B1 * | 11/2014 | Kerber | H01L 29/66795 438/153 |
| 9,397,099 | B1 * | 7/2016 | Huang | H01L 29/785 |
| 2005/0051825 | A1 * | 3/2005 | Fujiwara | H01L 29/41733 257/308 |
| 2014/0323731 | A1 * | 10/2014 | Johnson | C07D 471/06 546/23 |
| 2016/0071945 | A1 * | 3/2016 | Wang | H01L 29/42392 257/347 |

* cited by examiner

*Primary Examiner* — Marc Armand
*Assistant Examiner* — Sarah Salerno
(74) *Attorney, Agent, or Firm* — Yuanmin Cai; Hoffman Warnick LLC (57) ABSTRACT

Aspects of the present disclosure include finFET structures with varied cross-sectional areas and methods of forming the same. Methods according to the present disclosure can include, e.g., forming a structure including: a semiconductor fin positioned on a substrate, wherein the semiconductor fin includes: a gate area, and a terminal area laterally distal to the gate area, a sacrificial gate positioned on the gate area of the semiconductor fin, and an insulator positioned on the terminal area of the semiconductor fin; removing the sacrificial gate to expose the gate area of the semiconductor fin; increasing or reducing a cross-sectional area of the gate area of the semiconductor fin; and forming a transistor gate on the gate area of the semiconductor fin.

18 Claims, 12 Drawing Sheets

TRANSISTOR STRUCTURE WITH VARIED GATE CROSS-SECTIONAL AREA

FIELD OF THE INVENTION

The subject matter disclosed herein relates to transistor structures with varied gate cross-sectional areas, and methods of fabricating the same. More specifically, aspects of the invention relate to finFET transistors in which a portion of a semiconductor fin, positioned beneath a gate, is shaped to have a greater or reduced cross-sectional area relative to laterally distal portions of the semiconductor fin.

BACKGROUND

In integrated circuit (IC) structures, a transistor is a critical component for implementing digital circuitry designs. Generally, a transistor includes three electrical terminals: a source, a drain, and a gate. By applying different voltages to the gate terminal, the flow of electric current between the source and the drain can be turned on and off. A common type of transistor is a metal oxide field effect transistor (MOSFET). One example of a MOSFET is a "FinFET," typically formed upon a semiconductor-on-insulator (SOI) layer and buried insulator layer. A FinFET can include a semiconductor substrate etched into a "fin" shaped body, with one side of the fin acting as a source terminal and the other side of the fin acting as a drain terminal. A gate structure, which may be at least partially conductive, can be formed around one or more of the semiconductor fins. By applying a voltage to the gate structure, an electrically conductive channel can be created between the source and drain terminals of each fin in contact with the gate.

Over time, improvements to the structure and performance of a transistor, in addition to the ever-decreasing size of these components, have presented significant technical and manufacturing challenges. FinFETs in particular present conflicting demands for high yield processes and high-performance FETs. In some cases, the need to couple one component to another may limit the size of particular structures even when a remainder of the same structure can be reduced in size. As a result, the ability to fully realize spatial improvements to some circuit elements may be limited by competing physical constraints on an IC product.

BRIEF SUMMARY

A first embodiment of the present disclosure provides a method including: forming a structure including: a semiconductor fin positioned on a substrate, wherein the semiconductor fin includes: a gate area, and a terminal area laterally distal to the gate area, a sacrificial gate positioned on the gate area of the semiconductor fin, and an insulator positioned on the terminal area of the semiconductor fin; removing the sacrificial gate to expose the gate area of the semiconductor fin; reducing a cross-sectional area of the gate area of the semiconductor fin; and forming a transistor gate on the gate area of the semiconductor fin.

A second embodiment of the present disclosure provides forming a structure including: a semiconductor fin positioned on a substrate, wherein the semiconductor fin includes: a gate area, and a terminal area laterally distal to the gate area, a sacrificial gate positioned on the gate area of the semiconductor fin, and an insulator positioned on the terminal area of the semiconductor fin; removing the sacrificial gate to expose the gate area of the semiconductor fin; increasing a cross-sectional area of the gate area of the semiconductor fin; and forming a transistor gate on the gate area of the semiconductor fin.

A third embodiment of the present disclosure provides a transistor structure comprising: a semiconductor fin positioned on a substrate, wherein the semiconductor fin includes: a first gate area having a first cross-sectional area, and a terminal area laterally distal to the first gate area and having a second cross-sectional area, wherein the first cross-sectional area is different from the second cross-sectional area; a transistor gate positioned on the first gate area of the semiconductor fin; and a contact positioned on the terminal area of the semiconductor fin.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Embodiments of the present disclosure provide transistor structures for integrated circuits (ICs) to enhance manufacturability and performance. The present disclosure also contemplates methods for fabricating the transistor structure described herein. Generally, a transistor structure according to the present disclosure can include a semiconductor fin positioned on a substrate, and subdivided into two areas: a "gate area" dimensioned to have a first cross-sectional area, and a "terminal area" positioned laterally distal to the gate area and featuring a second cross-sectional area different from the first cross-sectional area. The gate area and terminal area of the semiconductor fin may otherwise have substantially identical material compositions. A transistor gate can be positioned on the first gate area of the semiconductor fin, while a contact can be positioned on the terminal area of the semiconductor fin. The differences in cross-sectional area throughout the semiconductor fin can yield a different threshold voltage for a transistor gate. Threshold voltage, as described herein, generally refers to a minimum magnitude of electrical potential applied to a transistor gate to form a conductive channel region between two adjacent terminals. Past efforts to provide an adjustable threshold voltage in a finFET have proven challenging, and researchers have attempted to vary the threshold voltage of a manufactured device by a wide variety of technical approaches. In some embodiments of the present disclosure, the gate area of the semiconductor fin can have a larger cross-sectional area than the terminal area to provide a lower threshold voltage. In other embodiments, the gate area can have a smaller cross-sectional area than the terminal area to provide a higher threshold voltage. These differences in threshold voltage can stem from the amount of contact area between the fin and the gate. Methods of fabricating structures according to embodiments of the present disclosure are also described.

Figure 1:
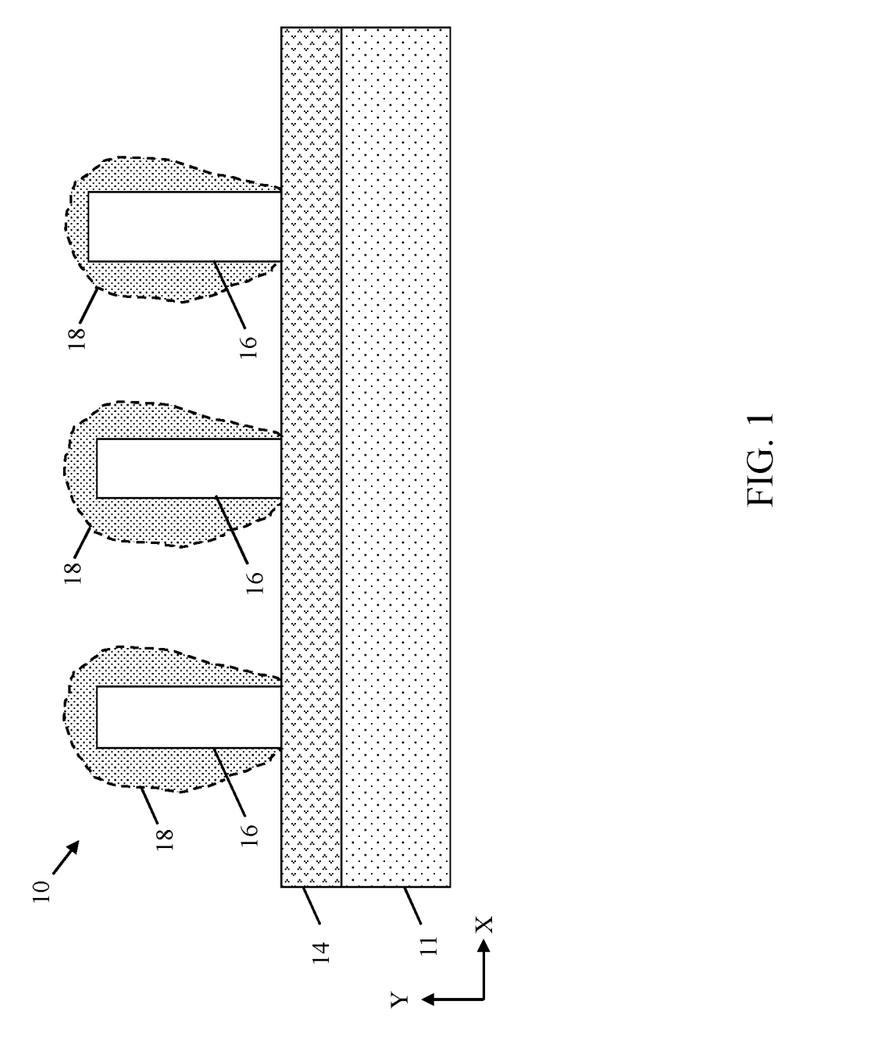
FIG. 1 shows a cross-sectional view in plane X-Y of an initial structure formed according to embodiments of the present disclosure.

Referring to FIG. 1, processes of forming an IC according to aspects of the present disclosure are shown. Structure 10 can be provided and/or formed in conventional process steps, before being modified in methods according to the present disclosure, and/or pursuant to other techniques, to yield an IC structure according to embodiments of the present disclosure. A substrate 11 of structure 10 can be composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 11 or a portion thereof may be strained.

A buried insulator layer 14 can be formed on and positioned above substrate 11. Buried insulator layer 14 may be composed of any insulating material such as $SiO_2$ or a dielectric having a high dielectric constant, which may be, for example, above 3.9. In some situations, buried insulator layer 14 may be composed of an oxide substance, and correspondingly may be referred to as a buried oxide (BOX) layer. Materials appropriate for the composition of buried insulator layer 14 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties.

A group of semiconductor fins 16 can be formed on buried insulator layer 14. One example process by which semiconductor fins 16 can be formed on buried insulator layer 14 is wafer bonding. "Wafer bonding" generally can refer to a process in which two semiconductor wafers are bonded together, forming a single substrate material. The bonded semiconductor wafers can be cut using any currently known or later developed semiconductor or SOI fabrication process. As one example, a semiconductor material can be formed by implanting a bonded wafer with hydrogen and then annealing the wafer, causing it to split along the plane of the implanted hydrogen. Semiconductor fins 16 can, together with substrate 11 and buried insulator layer 14, form a semiconductor-on-insulator (SOI) structure. Semiconductor fins 16 can be composed of, for example, silicon or another semiconductor material, and optionally may have the same material composition as substrate 11.

IC structures according to embodiments of the present disclosure can take the form of a finFET component. A finFET generally refers to a FET design typically built from an SOI substrate, where semiconductor material positioned on a buried insulator layer is etched into one or more fin-shaped structures to act as a channel. A gate component and/or other elements of the resulting finFET can be formed around and over the fin(s), as detailed in other process steps outlined herein. One or more of semiconductor fins 16 can be formed from a single semiconductor layer via any currently known or later developed process of removing a portion of a semiconductor material, e.g., depositing a material and performing a pattern etch. As used herein, the term "depositing" may include any now known or later developed technique appropriate for deposition, including but not limited to, for example: chemical vapor deposition (CVD), low-pressure CVD (LPCVD), plasma-enhanced CVD (PECVD), sub-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. In addition, "removing" as used herein can include any one of various material removal or polishing techniques now known or later developed, e.g., etching, a reactive ion etch (RIE), etc. "RIE" or "reactive ion etch" refers to a variation of plasma etching in which, during etching, a semiconductor wafer is placed on an RF powered electrode. Throughout RIE, the wafer may take on an electric potential which accelerates the etching species extracted from plasma toward the etched surface.

Although three semiconductor fins 16 are shown in the accompanying FIGS. 1-12 as an example, a single FinFET structure can include only one semiconductor fin 16, or any desired greater number of semiconductor fins. In alternative embodiments, semiconductor fins 16 can be formed by removing portions of buried insulator layer 14 and forming semiconductive material therein (e.g., by deposition). Although semiconductor fins 16 are shown by example as protruding from buried insulator layer 14, it is understood that embodiments of the present disclosure can be applied to semiconductor fins 16 which extend through buried insulator layer 14 to contact substrate 11. In any event, each semiconductor fin 16 can initially include a first cross-sectional area which may be substantially uniform throughout its entire structure. To assist in forming additional conductive structures on each semiconductor fin 16, a group of doped semiconductor regions 18 (shown in phantom) can optionally be formed on semiconductor fin(s) 16, e.g., by epitaxial growth followed by rapid thermal annealing (RTA). During the forming of doped semiconductor regions 18, a portion of the dopants thereof may diffuse into semiconductor fin(s) 16. Nevertheless, doped semiconductor region(s) 18 may be structurally distinct from semiconductor fin(s) 16 and each can partially enclose the lateral cross-sectional area of respective semiconductor fin(s) 16.

Figure 2:
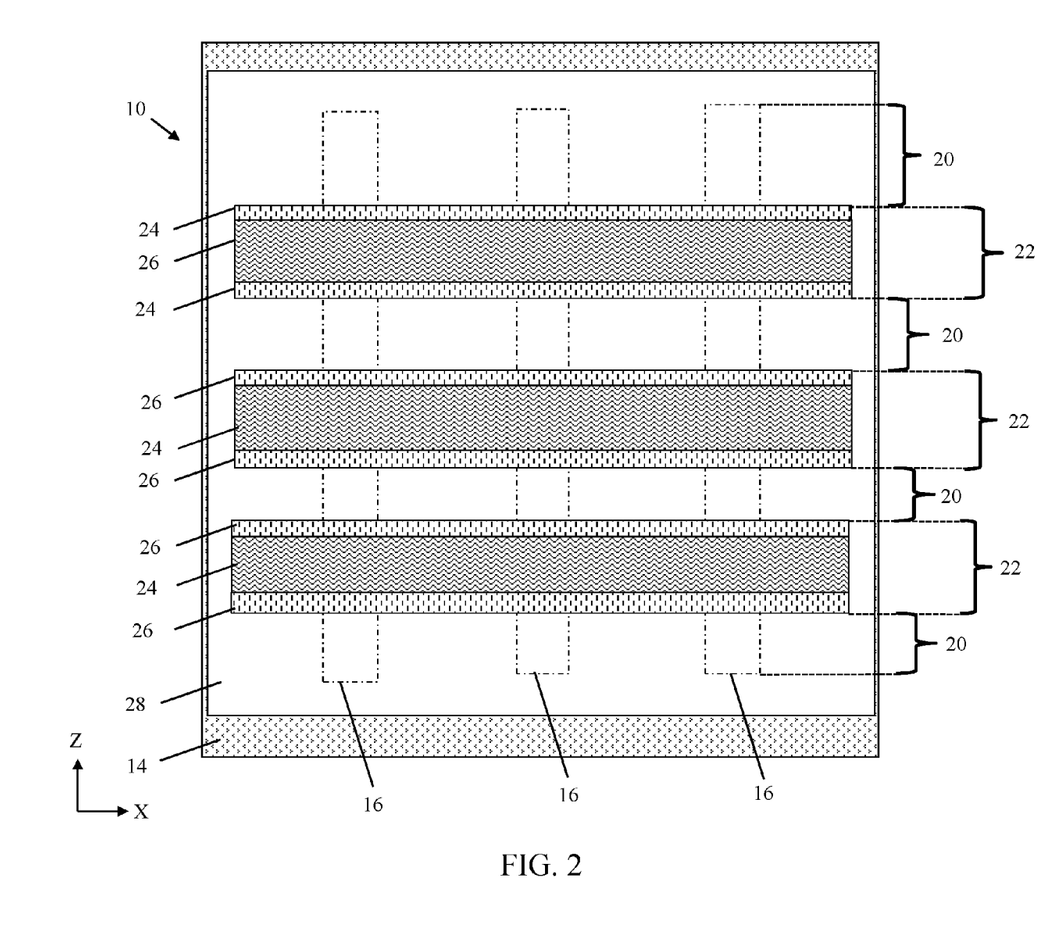
FIG. 2 shows a plan view in plane X-Z of an initial structure formed in embodiments of the present disclosure.

A top-down view of structure 10 to be processed according to the present disclosure is provided in FIG. 2. Portions of structure 10 can be identified as positioned within one of several distinct locations, referred to herein as "areas." Each area can be identified by reference to structures or materials formed on semiconductor fin 16 and/or adjacently thereto, and otherwise may include the same or similar material compositions. For example, structure 10 can include one or more terminal areas 20, which include a portion of semiconductor fin 16 where contacts to a source or drain of a transistor structure may be formed in other process steps. In addition, structure 10 can include one or more gate areas 22, separated by one or more terminal areas 20 adjacent to gate areas 22. Gate areas 22 can provide a location where gate contacts may be formed to control channel formation in a transistor structure. In addition to including the structure of semiconductor fin(s) 16 as the referenced locations, each terminal area 20 and gate area 22 can include portions of buried insulator layer 14 and other insulating components positioned beneath, laterally between, and/or above each semiconductor fin 16.

As discussed herein, semiconductor fin(s) 16 in terminal area(s) 20 (shown in phantom) and gate area(s) 22 may be substantially identical to each other e.g., by having no structural differences which influence the performance of a resulting transistor. Processes according to the present disclosure can operate on and/or modify gate area 22 differently from terminal area 20, as discussed elsewhere herein. A sacrificial gate 24 can be formed on semiconductor fin 16. Sacrificial gate 24 can be formed by deposition and patterning and/or any other currently known or later developed process of forming an at least partially conductive material or a metal on another component. In an embodiment, sacrificial gate 24 can be in the form of a single or multi-layered component including metals or semiconductive materials such as polycrystalline silicon. Sacrificial gate 24 can also be formed to contact and overlie buried insulator layer 14 and semiconductor fins 16, e.g., with a portion of sacrificial gate 24 laterally abutting semiconductor fins 16. Substrate 11 (FIG. 1) is omitted from FIG. 2 for the purposes of clarity, and it is understood that substrate 11 can be positioned beneath buried insulator 14 and extend laterally beyond the surface area where semiconductor fin 18 contacts buried insulator layer 14.

Each sacrificial gate can include spacers 26 formed on buried insulator layer 14 and semiconductor fin 16. Each spacer 26 can laterally abut a sidewall of sacrificial gate 24, such that each spacer 26 contacts sacrificial gate 24 and semiconductor fin 16 in addition to buried insulator layer 14. Spacers 26 can be formed, e.g., by deposition on buried insulator layer 14 and semiconductor fin 16, and sacrificial gate 20. To expose sacrificial gate 24, portions of each spacer 26 can be removed and/or planarized. Spacers 26 can physically and electrically isolate sacrificial gate 24 from other components of an IC structure, e.g., other wires and components in close proximity to sacrificial gate 24. Spacers 26 can also support the structural interface between semiconductor fin(s) 16 and other elements. In some embodiments, each spacer 26 can be formed as a coating on semiconductor fin(s) 16, sacrificial gate 24, and/or other elements. Each spacer 26 can be composed of, e.g., an insulating material such as a nitride or an oxide compound, including, for example, one or more of the insulating materials described herein.

An insulator 28 can be formed on buried insulator layer 14, e.g., by deposition followed by selective etching and/or removal of excess material formed on portions of semiconductor fin(s) 16 and/or other elements discussed herein. Insulator 28 can contact and/or partially cover semiconductor fin(s) 16, e.g., at terminal area 20. Insulator 28 can separate semiconductor fin(s) 16 from layers formed thereon in a subsequent process, and thus can be embodied as an interlayer dielectric (ILD) material. Insulator 28 can be composed of one or more of the insulating materials described herein relative to buried insulator layer 14, or can be composed of any other currently known or later developed insulating material. For example, insulator 28 can be composed of a flowable oxide formed on buried insulator layer 14. Portions of insulator 28 can then be removed (e.g., by etching) to form sacrificial gate 24 and/or spacers 26 therein, and in some embodiments insulator 28 may be formed on previously formed sacrificial gates 24 and/or spacers 26. In any case, portions of sacrificial gate 24, spacers 26, and/or insulator 28 can be removed (e.g., by a planarization process), such that sacrificial gate 24, spacers 26, and insulator 28 are coplanar across their upper surfaces.

Figure 3:
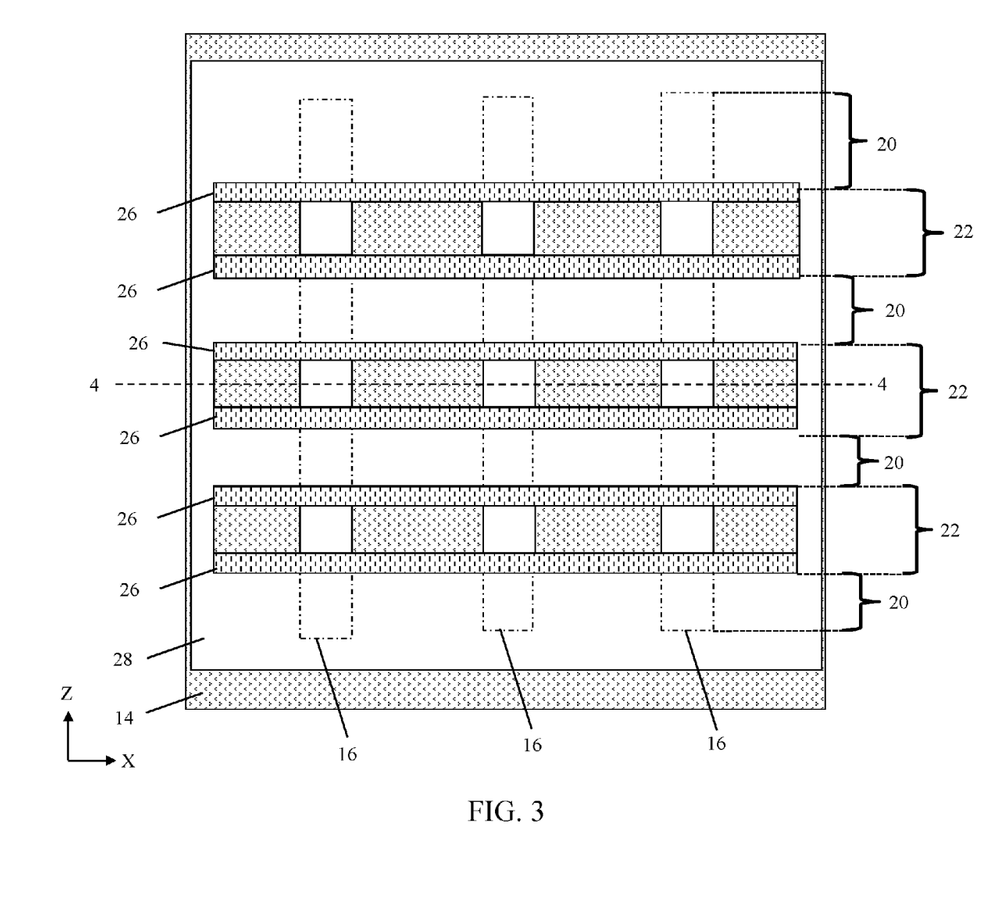
FIG. 3 shows a plan view in plane X-Z of a structure with exposed gate areas according to embodiments of the present disclosure.
Figure 4:
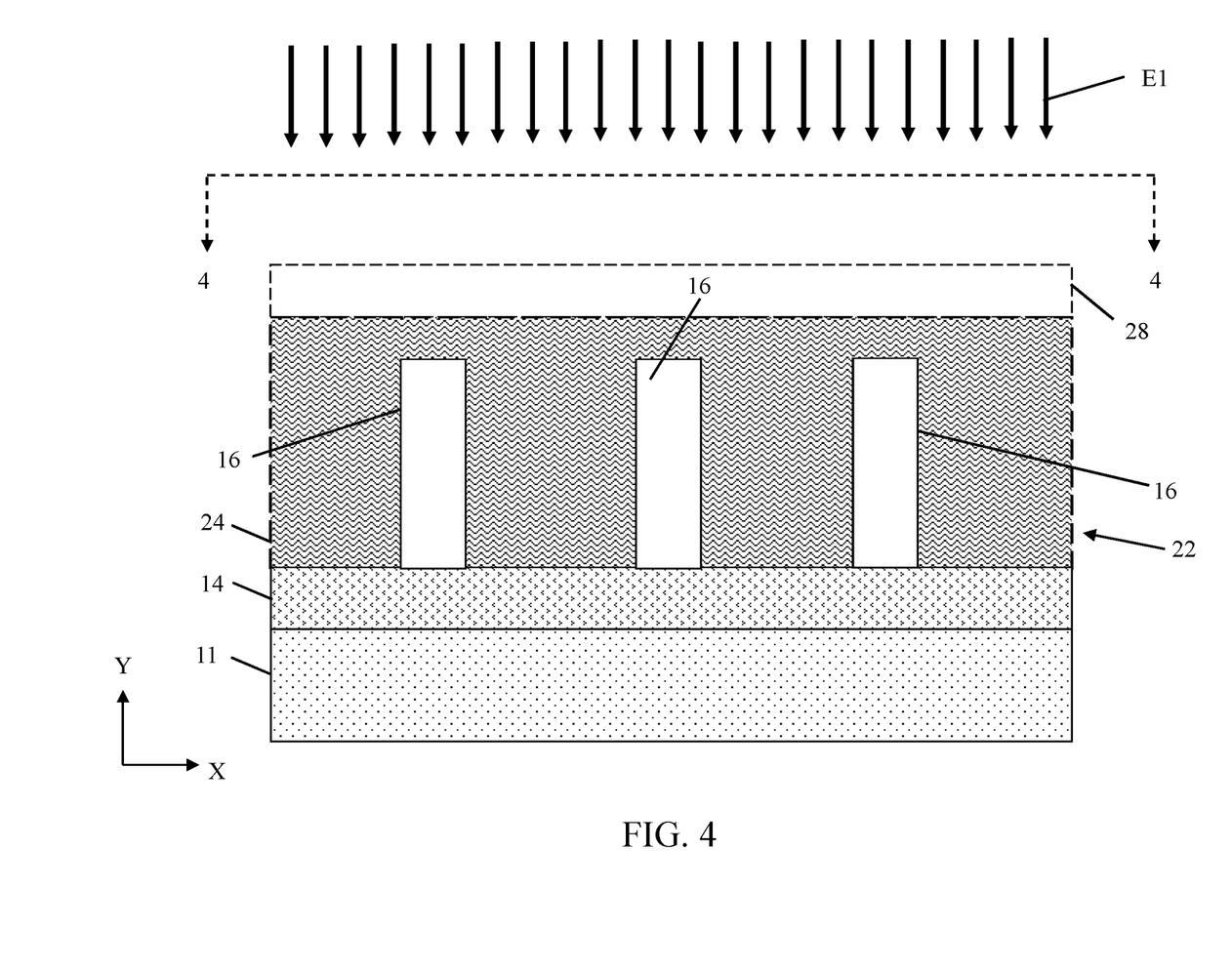
FIG. 4 shows a cross-sectional view in plane X-Y of a structure with exposed gate areas according to embodiments of the present disclosure.

Referring to FIGS. 3 and 4 (cross-section along line 4-4' of FIG. 3) together, embodiments of the present disclosure can include removing sacrificial gate(s) 24 to expose a portion of buried insulator layer 14 and semiconductor fin(s) 16 within gate area(s) 22. Sacrificial gate 24 can be removed by, e.g., a selective etching process such as chemical etching. In other embodiments, etch masks (not shown) can be placed on spacers 26 and/or portions of insulator 28, while sacrificial gate(s) 24 and/or portions of insulator 28 overlying sacrificial gate(s) 24 remain exposed. Where sacrificial gate 24 is composed of polycrystalline silicon, sacrificial gate 24 can be removed by a particular etching solution (e.g., a hydrogen fluoride—water solution) E1 which removes the crystalline polysilicon of sacrificial gate 24 while not affecting other materials, e.g., spacers 26, insulator 28, etc. Semiconductor fin(s) 16 in gate area(s) 22 can thus be exposed after sacrificial gate 24 is removed.

To yield varied operational characteristics (e.g., threshold voltages), embodiments of the present disclosure can include modifying one or more semiconductor fin(s) 16 within gate area(s) 22 without modifying the remainder of each semiconductor fin 16 (including portions within terminal area(s) 20). In one example, embodiments of the present disclosure can include increasing a cross-sectional area of semiconductor fin(s) 16 within gate area(s) 22. In another example, embodiments of the present disclosure can include reducing a cross-sectional area of semiconductor fin(s) 16 within gate area(s) 22. Varying the cross-sectional area of semiconductor fin(s) 16 can affect physical properties for a transistor, such as threshold voltage. The threshold voltage of a transistor gate formed within gate area(s) 22 can vary, e.g., by increasing or decreasing the surface area of semiconductor fin(s) 16 in gate area(s) 22.

Figure 5:
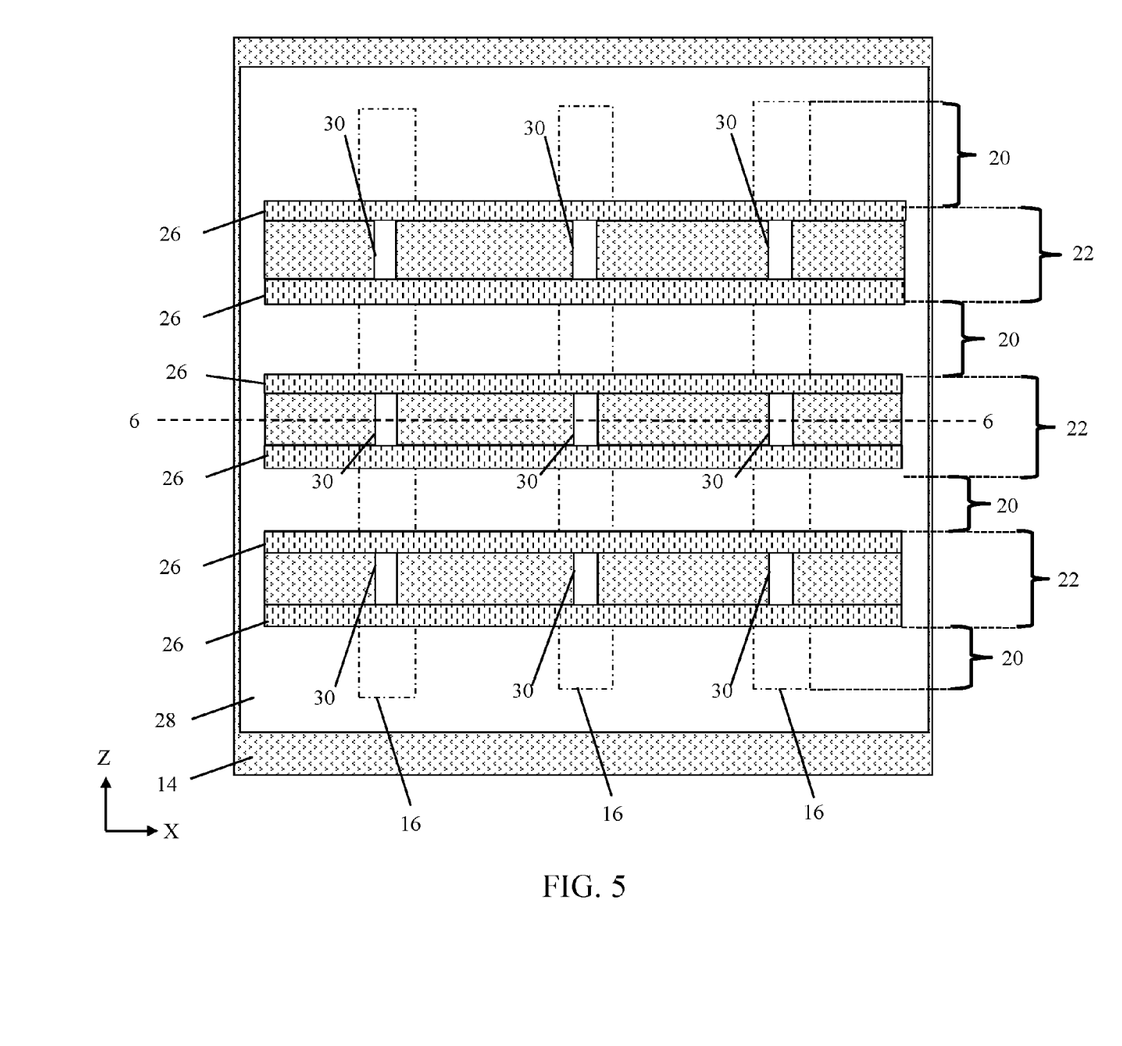
FIG. 5 shows a plan view in plane X-Z of a structure with gate areas exhibiting a reduced cross-sectional area according to embodiments of the present disclosure.
Figure 6:
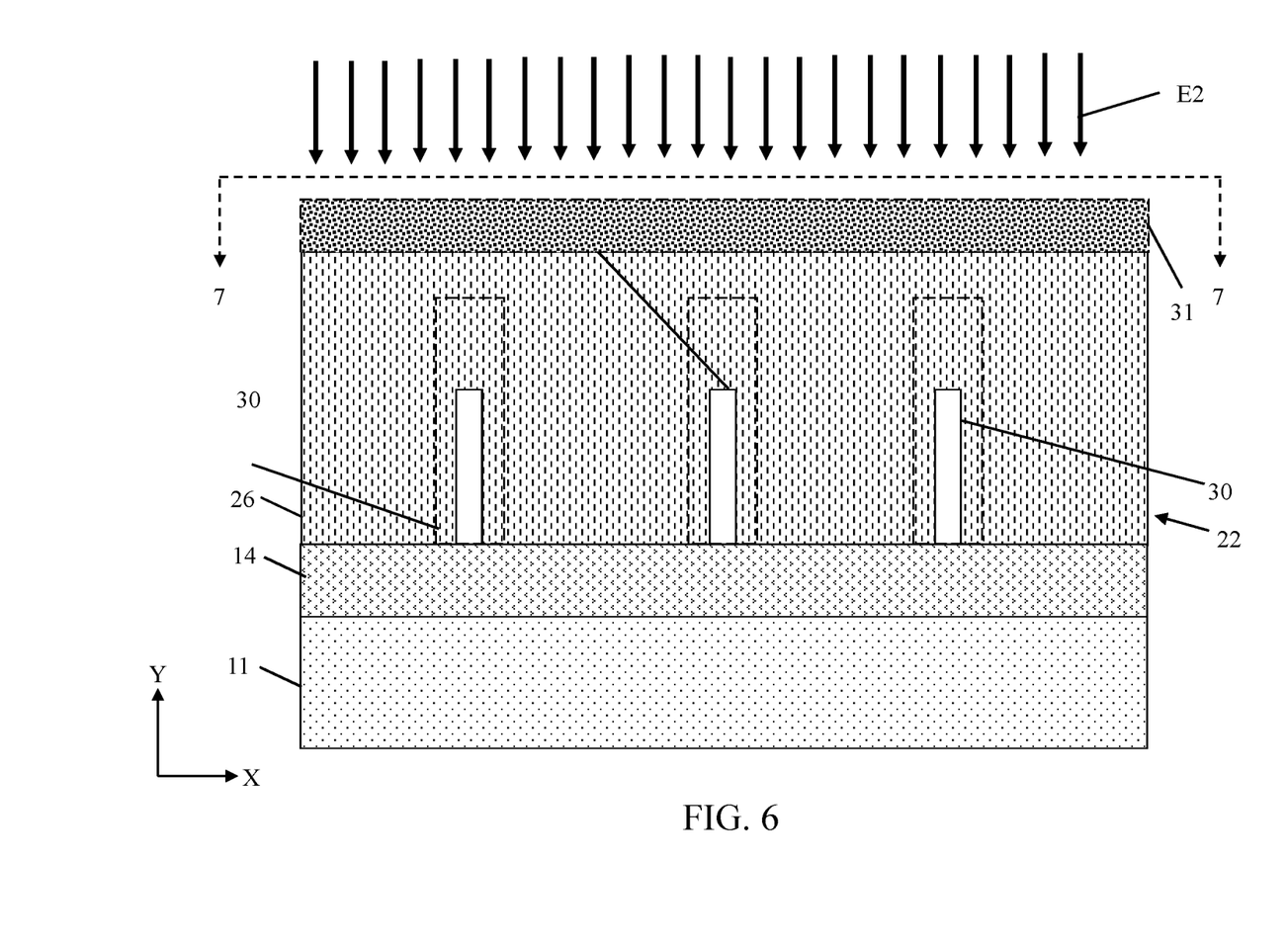
FIG. 6 shows a cross-sectional view in plane X-Y of a structure with gate areas exhibiting a reduced cross-sectional area according to embodiments of the present disclosure.

Referring to FIGS. 5 and 6 (cross-section along line 6-6 of FIG. 5) together, an embodiment of the present disclosure can include reducing the cross-sectional area of one or more semiconductor fin(s) 16. Initially, semiconductor fin(s) 16 in gate area(s) 22 can have a cross-sectional area substantially equal to the cross-sectional area of semiconductor fin(s) 16 in terminal area(s) 20. It is understood that some semiconductor fins 16 can, optionally, remain underneath one or more other sacrificial gates 24 (FIGS. 1-2) not previously removed. Exposed portions of semiconductor fin(s) 16 within gate area(s) 22 can be shrunk according to processes described herein to yield reduced fins 30 extending, e.g., laterally through gate area 22 between spacers 26. To illustrate the reduced cross-sectional area of reduced fin(s) 30, a phantom cross-sectional outline of the initial cross-sectional area of semiconductor fin(s) 16 is shown in FIG. 6. Each reduced fin 30 can have approximately the same lateral dimension as sacrificial gate(s) 24, previously in the same position. The smaller cross-sectional area of reduced fins(s) 30, relative to other portions of semiconductor fin(s) 16, can increase a threshold voltage of gate contacts to reduced fin(s) 30 by reducing the contact area between the operative gate and semiconductor components. Although reduced fin (s) 30 are described separately from semiconductor fin(s) 16, it is understood that reduced fin(s) 30 represent a portion of semiconductor fin(s) 16, and thus are structurally continuous with semiconductor fin(s) 16.

To form reduced fin(s) 30, embodiments of the present disclosure can include selectively or non-selectively etching semiconductor fin(s) 16 within gate area(s) 22, without removing semiconductor fins(s) 16 altogether. In an example embodiment, semiconductor fin(s) 16 can be etched by applying a predetermined amount of hydrochloric acid (HCl) etchant E2 to semiconductor fin(s) 16. The predetermined amount of etchant can cause an outer region of exposed semiconductor fin(s) 16 to be removed, while leaving a remainder of its structure intact. As a result, reduced fin(s) 30 can include a reduced lateral cross-sectional area relative to the rest of semiconductor fin(s) 16, including portions thereof positioned within terminal area(s) 20. To protect other structures from reacting with the etchant materials, one or more masks or other protective elements 31 (shown in phantom) can be formed on other structures, e.g., spacers 26 and/or insulator 28. Where a selective etchant is used to form reduced fin(s) 30, the forming and subsequent removal of masks on insulator 28 outside gate area(s) 22 can be omitted.

In an alternative embodiment, semiconductor fin(s) 16 can be processed via oxidation to form reduced fin(s) 30. As described herein, the terms "oxidizing," "oxidation," and variants thereof refer to reacting a material with oxygen to form an oxide material. For example, "oxidizing" can include reacting oxygen gas with silicon and/or other semiconductor materials to form a chemically distinct material, e.g., silicon dioxide ($SiO_2$). Oxidation can be performed, e.g., via a wet oxidation process and/or a thermal oxidation process. Wet oxidation generally refers to a hydrothermal process of contacting a reacted material with liquid water or water vapor, and heating the liquid water or water vapor to an elevated temperature (e.g., between approximately 100° C. and approximately 374° C.) such that oxygen compounds in the liquid water or water vapor react with the material. Thermal oxidation refers to a microfabrication process in which an oxidizing agent (e.g., water vapor or molecular oxygen) is brought into contact with a target material (e.g., semiconductor fin(s) 16). The agent and material are then heated to a temperature between, e.g., approximately 800° C. and approximately 1200° C. to produce an oxide film (e.g., $SiO_2$) on an outer surface of the material. The ability for oxygen to selectively react with silicon without reacting with other substances (e.g., other oxide materials) can allow portions of semiconductor fin(s) 16 to be removed without affecting other materials. In an embodiment, an outer surface of exposed semiconductor fin(s) 16 can be oxidized to form an oxide material on the exterior of semiconductor fin(s) 16. Thereafter, the oxidized outer surface can be stripped away to yield reduced fin(s) 30.

Figure 7:
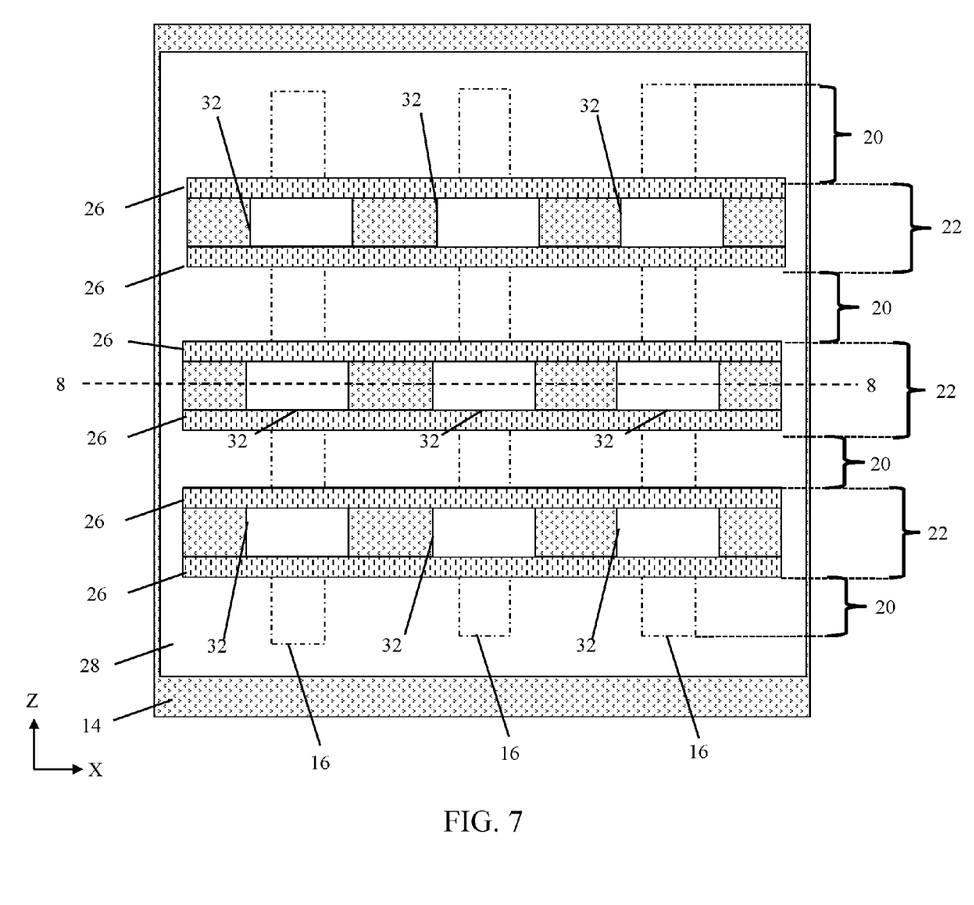
FIG. 7 shows a plan view in plane X-Z of a structure with gate areas exhibiting an increased cross-sectional area according to embodiments of the present disclosure.
Figure 8:
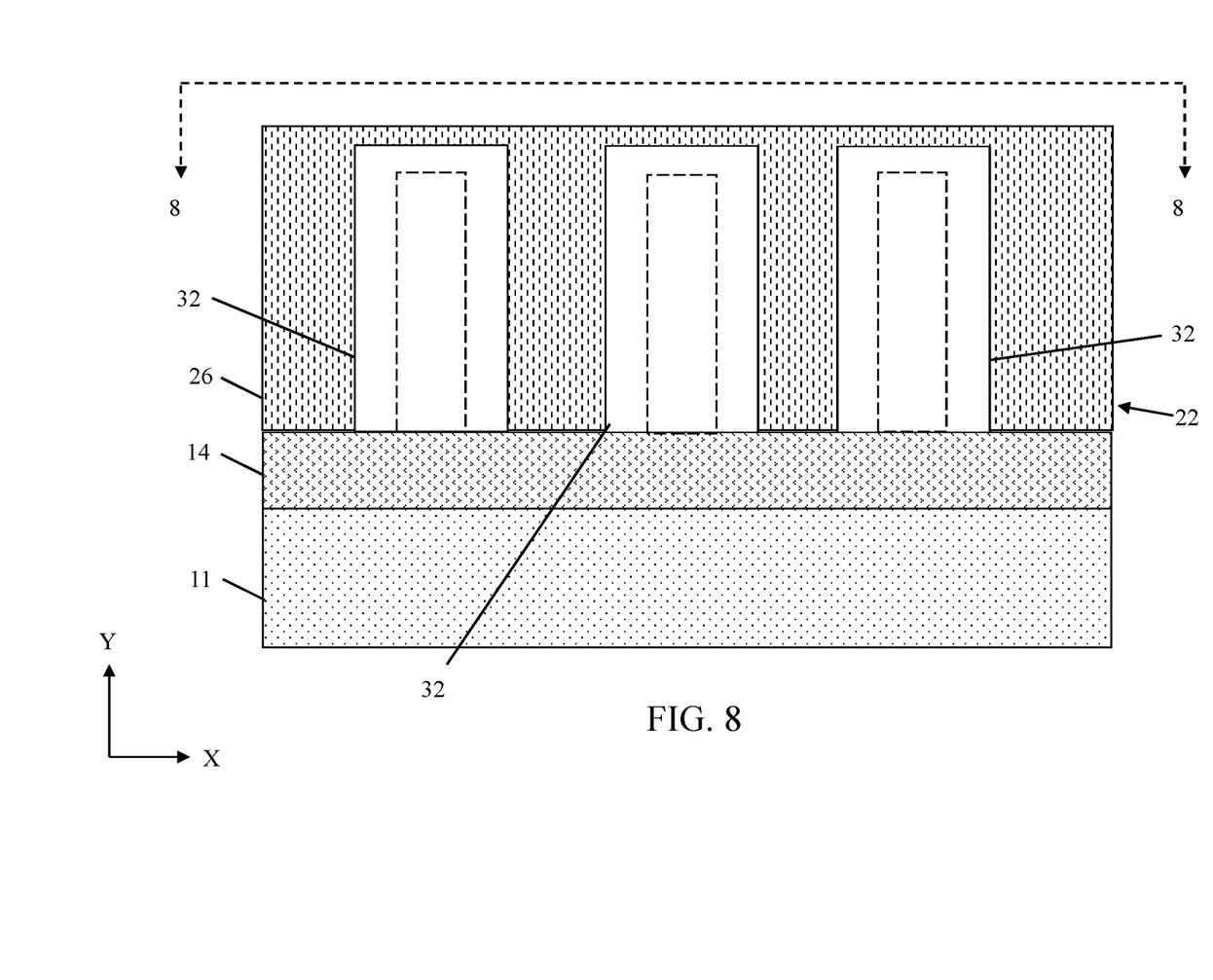
FIG. 8 shows a cross-sectional view in plane X-Y of a structure with gate areas exhibiting an increased cross-sectional area according to embodiments of the present disclosure.

Referring to FIGS. 7 and 8 (cross-section along line 8-8 of FIG. 7) together, embodiments of the present disclosure can additionally or alternatively include increasing the cross-sectional area of one or more semiconductor fin(s) 16. Similar to embodiments in which semiconductor fin(s) 16 are processed to yield reduced fin(s) 30, it is understood that selected semiconductor fins 16 can retain their original surface area, e.g., by not removing one or more sacrificial gates 24 (FIGS. 1-2). To illustrate the increased cross-sectional area of enlarged fin(s) 32, a phantom cross-sectional outline of the initial cross-sectional area of semiconductor fin(s) 16 is shown in FIG. 8. Exposed regions of semiconductor fin(s) 16 within gate area(s) 22 can be grown according to processes described herein to yield enlarged fins 32 extending, e.g., laterally through gate area 22 between spacers 26. Each enlarged fin 32 can have approximately the same lateral dimension as sacrificial gate(s) 24, previously in the same position. The greater cross-sectional area of enlarged fins(s) 32, relative to other portions of semiconductor fin(s) 16, can decrease a threshold voltage of gate contacts to enlarged fin(s) 32 by increasing the contact area between the operative gate and semiconductor components. Although enlarged fin(s) 32 are identified separately from semiconductor fin(s) 16, it is understood that enlarged fin(s) 32 represent a portion of semiconductor fin(s) 16, and thus are structurally continuous with semiconductor fin(s) 16.

Enlarged fin(s) 32 can be formed through any currently known or later developed process of forming materials on a surface and/or otherwise increasing the size of a component. An example embodiment of the present disclosure can include epitaxially forming a semiconductor coating on semiconductor fin(s) within gate area(s) 22 to yield enlarged fin(s) 32. Epitaxial growth or "epitaxy" can refer to a process in which a thin layer of single-crystal material is deposited on another single-crystal material, e.g., semiconductor fin(s) 16. Epitaxial growth can occur in such a way that the crystallographic structure of the substrate is reproduced in the formed material. The epitaxial coating can have the same material composition as semiconductor fin(s) 16, or alternatively can include another semiconductor material. For example, enlarged fin(s) 32 may be composed wholly or partially of a crystalline conductive or semiconductive material including, e.g., silicon (Si), silicon carbon (SiC), monocrystalline or polycrystalline silicon germanium (SiGe), silicon germanium carbon (SiGeC), Ge alloys, gallium arsenic (GaAs), indium arsenic (InAs), indium phosphorus (InP), other iii-V or ii-VI compound semiconductors, as well as organic conductors or semiconductors.

To further increase the size of exposed semiconductor fin(s) 16, embodiments of the present disclosure can optionally include annealing the formed semiconductor coating by thermal mixing and/or condensing. Thermal mixing can refer to a process where, e.g., atoms of semiconductor material (contained, e.g., in a reacting gas) intermix with semiconductor materials of semiconductor fin(s) 16 (e.g., germanium atoms of SiGe) to further increase the size of enlarged fin(s) 32. Condensing can refer to a process in which semiconductor fin(s) 16 are placed in a gaseous environment rich with semiconductive materials (e.g., silicon and/or germanium atoms) capable of forming on an outer surface of semiconductor fin(s) 16 by gas condensation, to yield enlarged fin(s) 32. Regardless of the selected process, semiconductor fin(s) covered by non-removed sacrificial gates 24 (FIGS. 1-2) and/or insulator 28 can maintain their original cross-sectional area.

Figure 9:
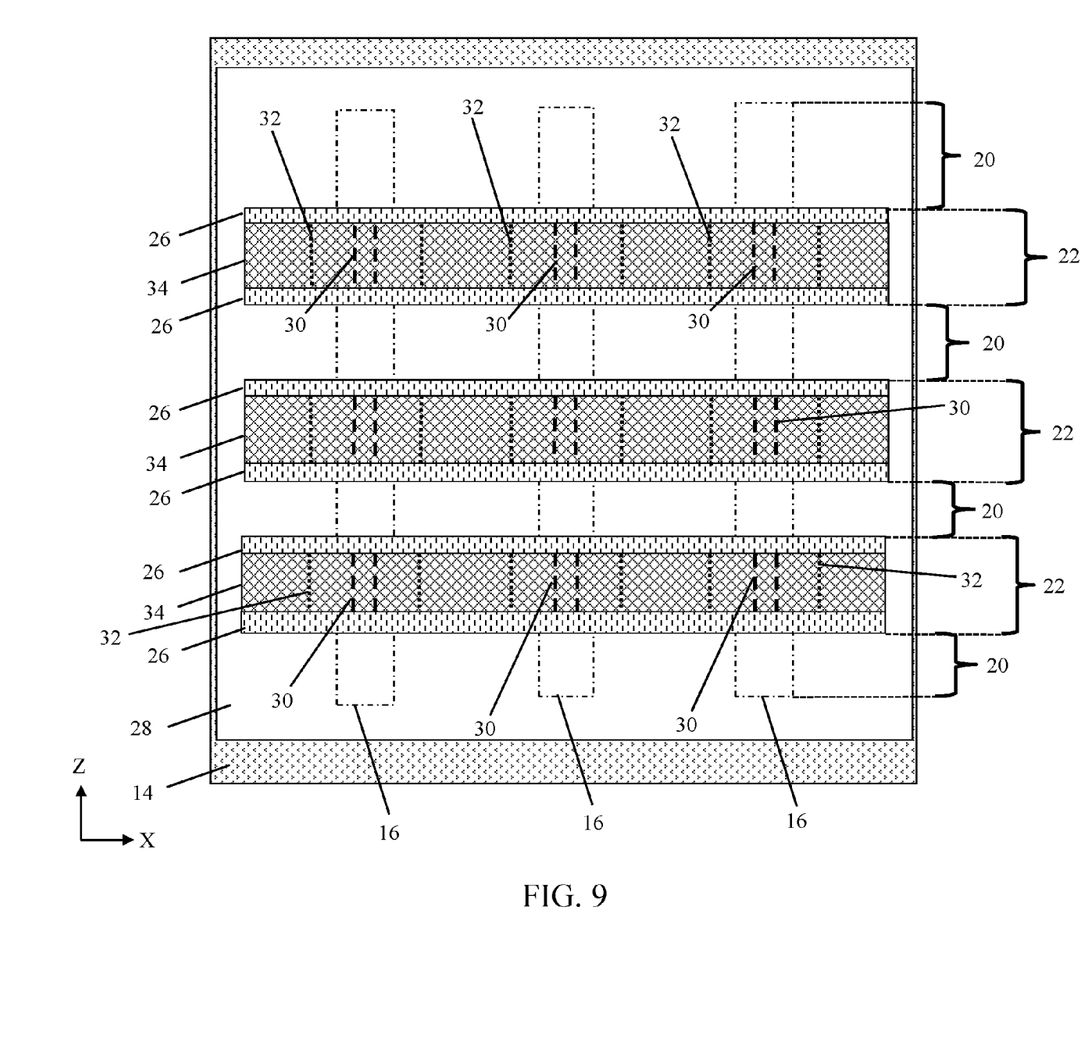
FIG. 9 shows a plan view in plane X-Z of a structure with transistor gates according to embodiments of the present disclosure.

Turning to FIG. 9, additional process steps can include forming a transistor gate 34, also known as a "gate stack," on reduced fin(s) 30 and/or enlarged fin(s) 32. Transistor gate 34 can function as an electrical contact to control the operation of a finFET transistor yielded in embodiments of the present disclosure. Transistor gate 34 can therefore be composed of an electrically conductive substance (e.g., a metal such as copper (Cu), aluminum (Al), gold (Au), etc.) positioned on the exterior surface of reduced fins(s) 30 and/or enlarged fin(s) 32. Transistor gate 34 can also include one or more dielectric materials (not shown) and/or other insulating materials positioned, e.g., beneath conductive elements of transistor gate 34 to provide a gate capacitance. As examples, transistor gate 34 can include dielectrics such as silicon oxide ($SiO_2$), hafnium oxide ($HfO_2$), zirconium silicate ($ZrSiO_4$), and/or other types of dielectric materials. Both reduced fin(s) 30 and enlarged fin(s) 32 are shown in FIG. 7 with phantom lines for the purposes of example. Structures formed according to embodiments of the present disclosure can therefore include a combination of reduced fins 30 and enlarged fins 32 therein. As discussed elsewhere herein, the increased contact area between transistor gate 34 and reduced fin(s) 30 can increase a respective threshold voltage of a resulting transistor, while the decreased contact area between transistor gate 34 and enlarged fin(s) 30 can decrease a respective threshold voltage of a transistor gate.

Figure 10:
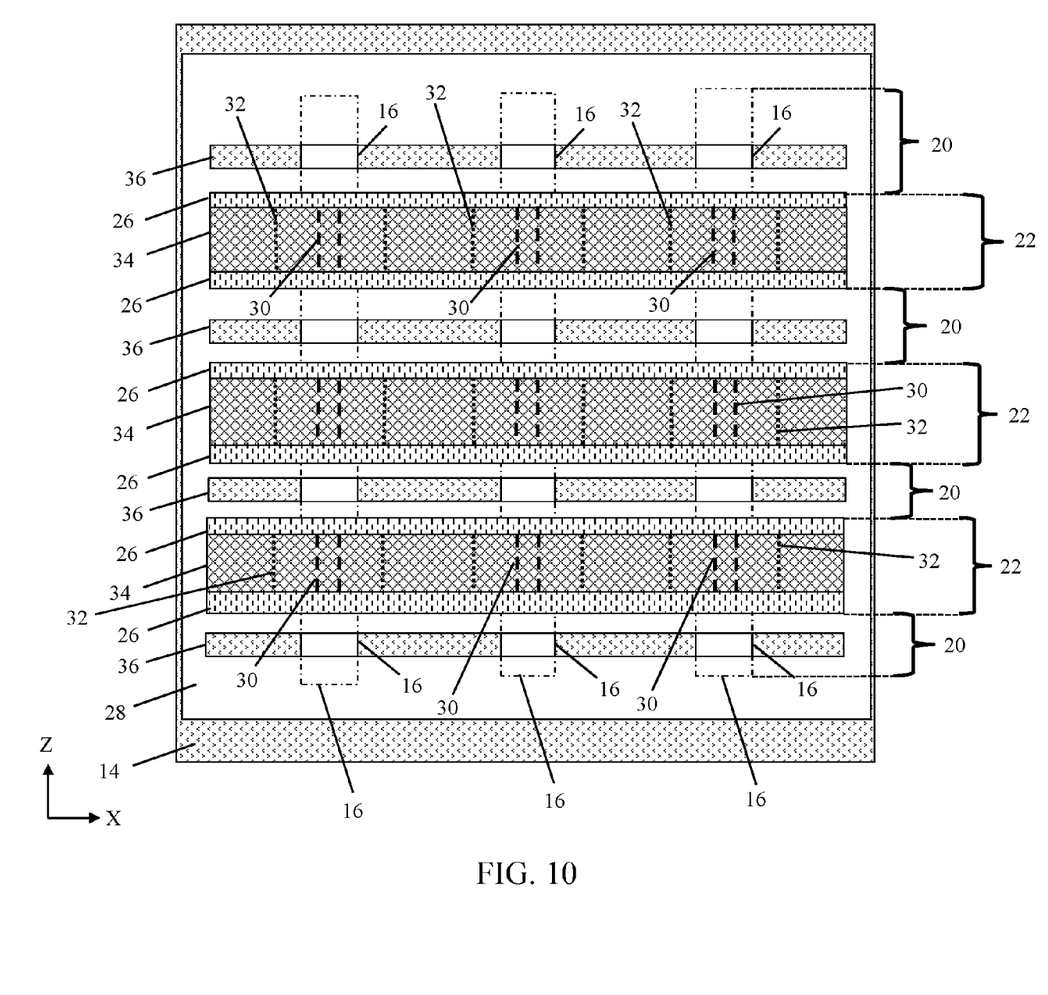
FIG. 10 shows a plan view in plane X-Z of a structure with exposed terminal areas according to embodiments of the present disclosure.

Turning to FIG. 10, other transistor elements can be formed in contact with semiconductor fin(s) 16 without modified cross-sectional areas. To form transistor terminals, portions of insulator 28 positioned within terminal area(s) 20 can be removed (e.g., via non-selective etch) to form trenches 36 therein. Each trench 36 can extend from an upper surface of insulator 28 to an upper surface of buried insulator 14 to expose semiconductor fin(s) 16. Trenches 36 can be formed before transistor gate(s) 34, where desired and/or applicable. The exposed semiconductor fin(s) 16 can retain their initial cross-sectional areas, and thus can be larger than reduced fins(s) 30 and smaller than enlarged fin(s) 32. Each trench 36 can be one of a pair of trenches 36 positioned laterally adjacent to corresponding reduced and/or enlarged fin(s) 30, 32. Contacts 38 (FIG. 11) of a transistor, composed of an electrically conductive material, can be formed in trenches 36 in other process steps.

Figure 11:
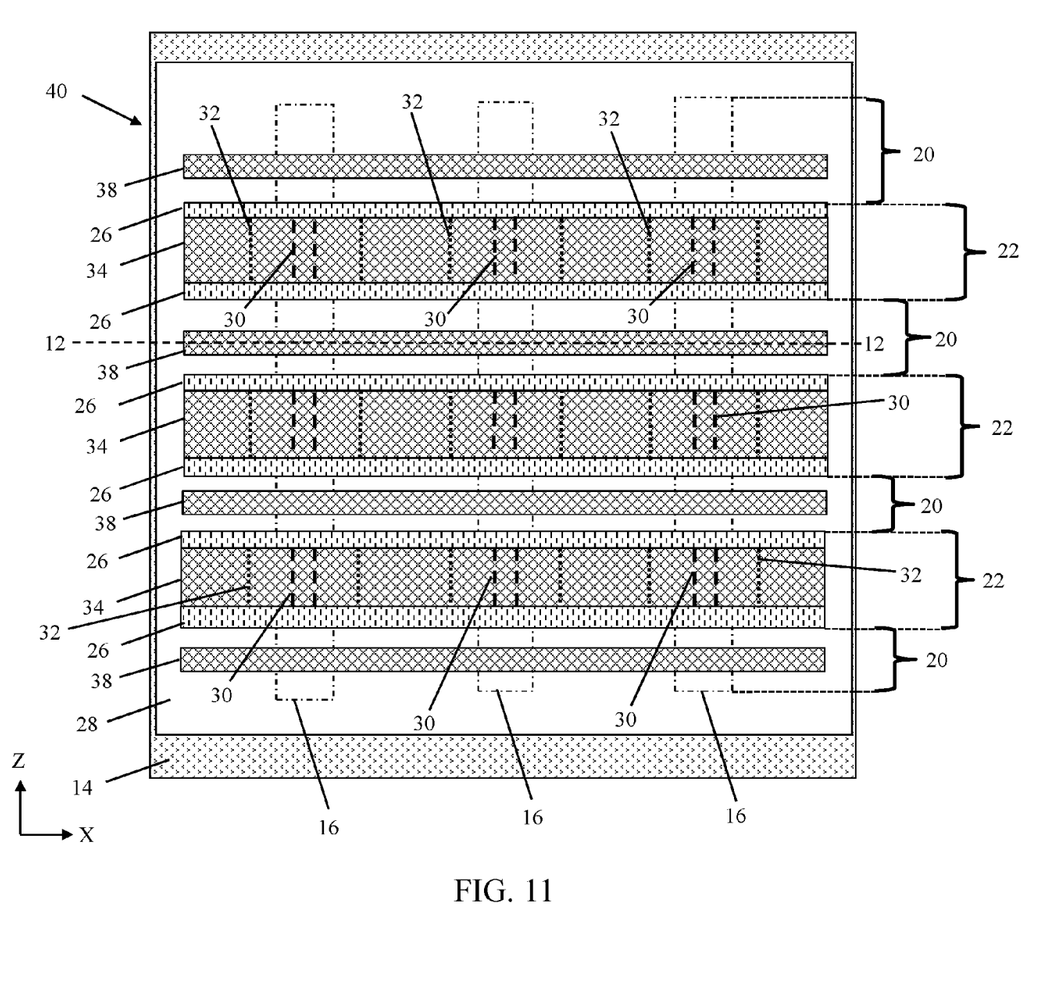
FIG. 11 shows a plan view in plane X-Z of a transistor structure according to embodiments of the present disclosure.

Referring to FIG. 11, a transistor structure 40 according to embodiments of the present disclosure is shown. To yield transistor structure 40, contacts 38 can be formed in trenches 36 (FIG. 10), e.g., by depositing one or more electrically conductive materials therein. It is understood that each contact 38 can be composed of one or more of the same substances used to form transistor gate(s) 34, discussed elsewhere herein. Where transistor gate(s) 34 and contact(s) 38 are formed in a unitary processing step (e.g., a single metal deposition), excess conductive materials can be removed from an upper surface of transistor structure 40, e.g., by CMP and/or other planarization techniques. Although not shown in FIGS. 1-12, it is understood that a refractory metal liner can be formed on the sidewalls of terminal area(s) 20 and/or gate area(s) 22, e.g., by deposition. Such liners can be composed of, e.g., as cobalt (Co), manganese (Mn), titanium (Ti), tungsten (W), ruthenium (Ru), iridium (Ir), rhodium (Rh) and platinum (Pt), etc., or mixtures of thereof (e.g., alloys), and in any case can physically separate adjacent components in a structure. Regardless of the chosen implementation, a pair of contacts 38 can be positioned laterally adjacent to corresponding transistor gates 34, such that each contact 38 to semiconductor fin 16 serves as a source/drain contact. A threshold voltage applied to transistor gate(s) 34 can thereby control the electrical connection between corresponding contacts 38, such that transistor structure 40 includes one or more finFET transistors therein.

Transistor structure 40 can include multiple semiconductor fins 16 positioned in contact with multiple transistor gates 34 and contacts 38, with semiconductor fin(s) 16 including a reduced and/or enlarged fin 30, 32 in contact with respective transistor gates 34. Reduced and enlarged fins 30, 32 are shown with phantom lines to designate their ability to vary between specific units. As a result, one reduced fin 30 or enlarged fin 32 can define a first cross-sectional area, with laterally adjacent portions of semiconductor fin 16 in terminal area(s) 20 exhibiting a second, different cross-sectional area. As illustrated in FIGS. 5-8, the second cross-sectional area for semiconductor fin(s) can be different from the first cross-sectional area. Specifically, the second cross-sectional area can be greater where gate dielectric 34 contacts reduced fin(s) 30 (as shown in FIGS. 5-6), or the second cross-sectional area can be less where gate dielectric 34 contacts enlarged fin(s) 32 (as shown in FIGS. 7-8). In some instances, a fabricator may desire for some transistor gates 34 to have a different threshold voltage from other transistor gates 34. In this situation, both reduced fins 30 and enlarged fins 32 can be formed in different parts of transistor structure 40, such that three or more cross-sectional areas are present.

Figure 12:
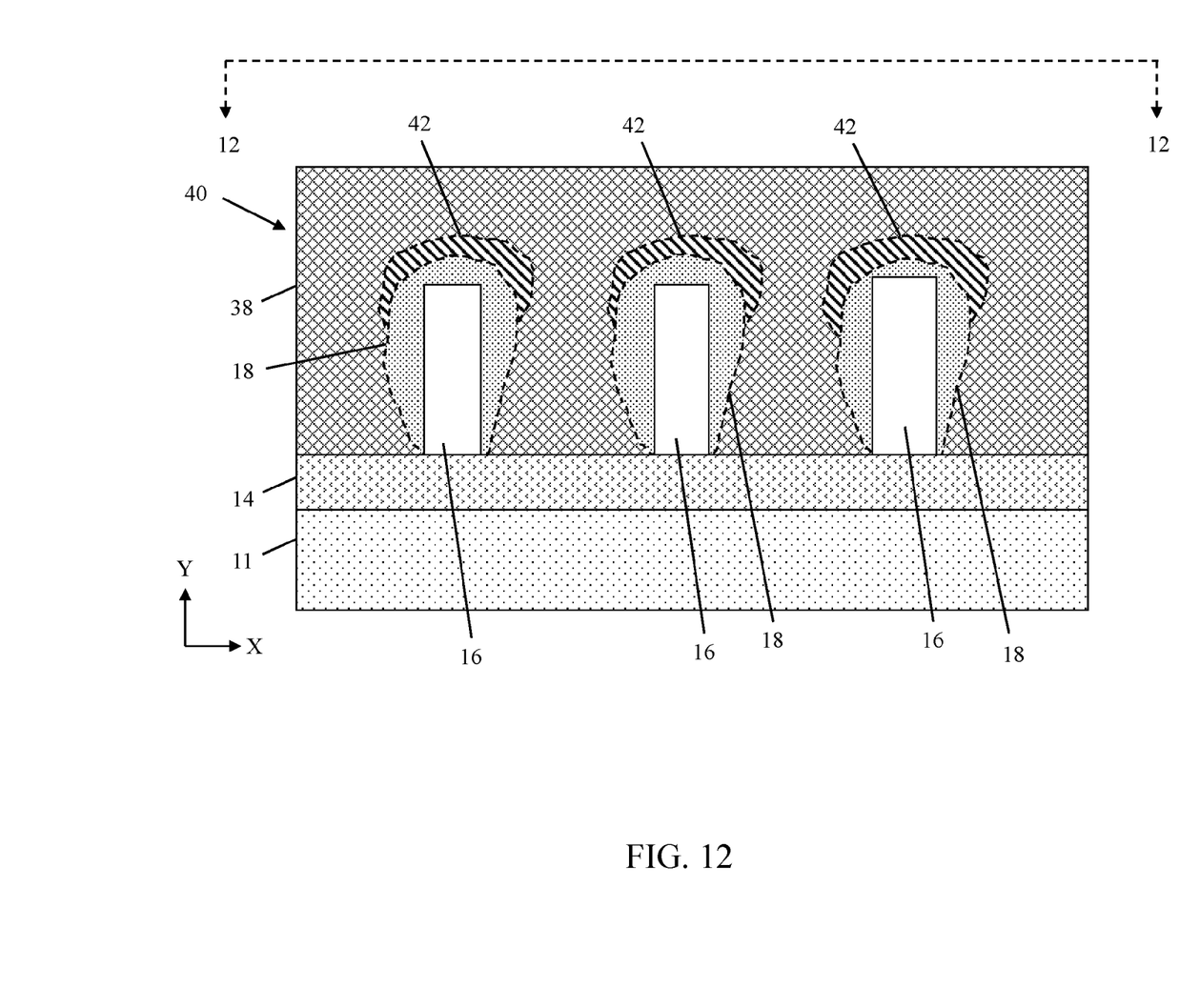
FIG. 12 shows a cross-sectional view in plane X-Y of a transistor structure according to embodiments of the present disclosure.

Turning to FIG. 12, a cross-sectional view of transistor structure 40 along line 12-12 of FIG. 11 is shown to illustrate additional features of contact 38. As discussed elsewhere herein, semiconductor fin(s) 16 can optionally include doped semiconductor region(s) 18 positioned thereon, e.g., within terminal area 20. Before forming contact 38 on semiconductor fin(s) 16, a silicide region 42 can be formed on doped semiconductor region(s) 18. In an embodiment, silicide region 42 may be formed using any now known or later developed technique, e.g., performing an in-situ pre-clean, depositing a metal such as titanium, nickel, cobalt, etc., annealing to have the metal react with doped semiconductor region(s) 18, and removing any unreacted metal. After forming contact(s) 38 on semiconductor fin(s) 16, silicide region 42 can increase the electrical conductivity between semiconductor fin(s) 16 and contact(s) 38. In addition, the presence of doped semiconductor region(s) 18 on semiconductor fin(s) 16 can allow the portion of semiconductor fin(s) 16 electrically coupled to contact(s) 38 to retain its initial cross-sectional area.

The resulting IC structures described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method comprising:
   forming a structure including:
      a semiconductor fin positioned on a substrate, wherein the semiconductor fin includes:
      a gate area, and a terminal area laterally distal to the gate area,
      a doped semiconductor region positioned on the semiconductor fin,
      a sacrificial gate positioned on the doped semiconductor region above the gate area of the semiconductor fin, and
      an insulator positioned on the doped semiconductor region above the terminal area of the semiconductor fin;
   removing the sacrificial gate and the doped semiconductor region on the gate area of the semiconductor fin to expose the gate area of the semiconductor fin;
   changing a cross-sectional area of the gate area of the semiconductor fin including changing a height and a width of the cross-sectional, wherein a bottommost surface of the semiconductor fin remains in contact with the substrate; and
   forming a transistor gate on the gate area of the semiconductor fin.

2. The method of claim 1, wherein the changing of the cross-sectional area of the gate area of the semiconductor fin includes:
   oxidizing an outer surface of the gate area of the semiconductor fin; and
   stripping the oxidized outer surface from the gate area.

3. The method of claim 2, wherein the oxidizing of the outer surface of the gate area includes a thermal oxidation.

4. The method of claim 2, wherein the oxidizing of the outer surface of the gate area includes a wet oxidation.

5. The method of claim 1, wherein, before the changing of the cross-sectional area of the gate area of the semiconductor fin, a cross-sectional area of the terminal area of the semiconductor fin is approximately equal to the cross-sectional area of the gate area of the semiconductor fin.

6. The method of claim 1, wherein the changing of the cross-sectional area of the gate area includes a hydrochloric acid (HCl) etching of the semiconductor fin.

7. The method of claim 1, wherein the changing of the cross-sectional area of the gate area of the semiconductor fin includes reducing the cross-sectional area of the gate area to increase a threshold voltage of the transistor gate on the gate area.

8. The method of claim 1, wherein the changing of the cross-sectional area of the gate area of the semiconductor fin includes increasing the cross-sectional area of the gate area to reduce a threshold voltage of the transistor gate on the gate area.

9. The method of claim 1, wherein a portion of the insulator is positioned on the sacrificial gate, wherein the removing of the sacrificial gate includes removing the portion of the insulator positioned on the sacrificial gate.

10. The method of claim 1, further comprising:
    forming a trench within the insulator to expose a portion of the doped semiconductor region on the terminal area of the semiconductor fin; and
    forming a contact to the exposed portion of the terminal area of the semiconductor fin.

11. The method of claim 1, wherein the changing of the cross-sectional area of the gate area includes epitaxially growing a semiconductor coating on the semiconductor fin.

12. The method of claim 11, wherein the changing of the cross-sectional area of the gate area further includes annealing the semiconductor coating by one of thermal mixing and condensing.

13. The method of claim 1, wherein the removing the sacrificial gate to expose the gate area of the semiconductor fin includes exposing a top surface of the fin.

14. A method comprising:
    forming a structure including:
       a semiconductor fin positioned on a substrate, wherein the semiconductor fin includes: a gate area having a first cross-sectional area, and a terminal area laterally distal to the gate area and having a second cross-sectional area, wherein the first cross-sectional area is approximately equal to the second cross-sectional area,
       a sacrificial gate positioned on the gate area of the semiconductor fin, and
       an insulator positioned on the terminal area of the semiconductor fin;
    removing the sacrificial gate to expose the gate area of the semiconductor fin;
    changing the first cross-sectional area of the gate area of the semiconductor fin, wherein the changing of the first cross-sectional area of the semiconductor fin increases or reduces a height and a width of the first cross-sectional area relative to the second cross-sectional area of the terminal area of the semiconductor fin, and wherein a bottommost surface of the semiconductor fin remains in contact with the substrate;
    forming a transistor gate on the gate area of the semiconductor fin after the changing of the first cross-sectional area;
    forming a trench within the insulator to expose a portion of the terminal area of the semiconductor fin, wherein the exposed portion of the terminal area of the semiconductor fin includes the second cross-sectional area;

forming a doped semiconductor region on the exposed portion of the terminal area of the semiconductor fin; and forming a contact to the doped semiconductor region on the terminal area of the semiconductor fin.

15. The method of claim 14, wherein the changing of the first cross-sectional area of the gate area of the semiconductor fin includes:

oxidizing an outer surface of the gate area of the semiconductor fin; and stripping the oxidized outer surface from the gate area.

16. The method of claim 14, wherein the changing of the first cross-sectional area of the gate area includes epitaxially growing a semiconductor coating on the semiconductor fin.

17. The method of claim 16, wherein the changing of the first cross-sectional area of the gate area further includes annealing the semiconductor coating by one of thermal mixing and condensing.

18. A method comprising:

forming a structure including:

a semiconductor fin positioned on a substrate, wherein the semiconductor fin includes:

a gate area, and a terminal area laterally distal to the gate area, a sacrificial gate positioned on the gate area of the semiconductor fin, and an insulator positioned on the terminal area of the semiconductor fin;

removing the sacrificial gate to expose the gate area of the semiconductor fin;

after removing the sacrificial gate, changing a cross-sectional area of the gate area of the semiconductor fin including increasing a height and a width of the cross-sectional area by epitaxially growing a semiconductor coating on the gate area of the semiconductor fin; and forming a transistor gate on the gate area of the semiconductor fin.

* * * * *